(12) United States Patent
Takase et al.

(10) Patent No.: US 8,310,257 B2
(45) Date of Patent: Nov. 13, 2012

(54) CONTACT STRUCTURE FOR INSPECTION

(75) Inventors: Shinichiro Takase, Nirasaki (JP); Kunihiro Furuya, Nirasaki (JP); Jun Mochizuki, Nirasaki (JP)

(73) Assignee: Tokyo Electron Limited (JP)

( * ) Notice: Subject to any disclaimer, the term of this patent is extended or adjusted under 35 U.S.C. 154(b) by 357 days.

(21) Appl. No.: 12/849,920

(22) Filed: Aug. 4, 2010

(65) Prior Publication Data
US 2011/0043232 A1 Feb. 24, 2011

(30) Foreign Application Priority Data
Aug. 20, 2009 (JP) ................................. 2009-190861

(51) Int. Cl.
*G01R 31/00* (2006.01)
(52) U.S. Cl. ................................. 324/755.01
(58) Field of Classification Search ........................ None
See application file for complete search history.

(56) References Cited

U.S. PATENT DOCUMENTS

| 7,498,827 | B2* | 3/2009 | Mochizuki et al. | ...... 324/756.03 |
| 7,716,824 | B2* | 5/2010 | Takekoshi | ....................... 29/842 |
| 2007/0290698 | A1* | 12/2007 | Mochizuki et al. | ........... 324/754 |
| 2010/0301887 | A1* | 12/2010 | Yonezawa et al. | ....... 324/756.03 |
| 2011/0006799 | A1* | 1/2011 | Mochizuki et al. | ...... 324/756.07 |
| 2011/0050267 | A1* | 3/2011 | Pagani | ..................... 324/756.03 |
| 2012/0194213 | A1* | 8/2012 | Komatsu et al. | ......... 324/756.03 |

FOREIGN PATENT DOCUMENTS

| EP | 0995996 | 4/2000 |
| JP | 2001-326257 | 11/2001 |
| JP | 2003-215160 | 7/2003 |
| WO | 99/04274 | 1/1999 |

* cited by examiner

*Primary Examiner* — Jermele M Hollington
(74) *Attorney, Agent, or Firm* — Cantor Colburn LLP

(57) ABSTRACT

A plurality of metal plates and an insulating plate having a polished surface are laminated in a probe supporting plate. Through-holes into which probes are to be inserted are respectively formed in the metal plates and the insulating plate. Diameters of the through-holes are greater than diameters of the through-holes, and the through-holes pass through the probe supporting plate in a thickness direction of the probe supporting plate. Hollow portions passing through the probe supporting plate in the thickness direction of the probe supporting plate are formed in the probe supporting plate. Each of the hollow portions is formed by connecting each of holes formed in each of the metal plates and each of holes formed in the insulating plate. Diameters of holes of a metal plate that is an uppermost layer, holes of a metal plate that is a lowermost player, and holes of a metal plate that is one of intermediate layers are less than diameters of holes of metal plates 30*d* that are the other intermediate layers.

18 Claims, 16 Drawing Sheets

(a)

(b)

(c)

(d)

CONTACT STRUCTURE FOR INSPECTION

CROSS-REFERENCE TO RELATED PATENT APPLICATIONS

This application claims the benefit of Japanese Patent Application No. 2009-190861, filed on Aug. 20, 2009, in the Japan Patent Office, the disclosure of which is incorporated herein in its entirety by reference.

BACKGROUND OF THE INVENTION

1. Field of the Invention

The present invention relates to a contact structure for inspection of electrical characteristics of an object to be inspected.

2. Description of the Related Art

Inspection of electrical characteristics of an electronic circuit, such as an IC, LSI, or the like, formed on, for example, a semiconductor wafer (hereinafter, referred to as a wafer) is performed by bringing a plurality of probes into contact with electrodes of the electronic circuit and making each of the probes apply an electrical signal for inspection to a corresponding electrode. The plurality of probes are formed of a metal material, for example, nickel or the like, and are inserted into and supported by a probe supporting plate. A plurality of through-holes into which the plurality of probes are to be inserted are formed in the probe supporting plate. Then, in order to appropriately perform the inspection, the probe supporting plate which supports the probes is formed of an insulating material that does not affect the electrical signals of the probes, for example, ceramic or the like.

In the formation of the plurality of through-holes in the probe supporting plate formed of ceramic or the like, all of the through-holes are formed by, for example, mechanical machining.

However, recently, as a pattern of an electronic circuit becomes finer, electrodes become finer, and distances between the electrodes become smaller. Therefore, probes which are to be brought into contact with the electrodes are being required to become finer and have a narrower pitch. That is, a plurality of fine through-holes need to be formed in a probe supporting plate. Accordingly, if all of the through-holes are formed by mechanical machining as described above, it takes a lot of time to manufacture the probe supporting plate. Also, since the number of processes for manufacturing the probe supporting plate is increased, manufacturing costs are also increased.

Accordingly, a probe supporting plate having a structure in which a plurality of thin metal plates are laminated is suggested in a conventional art. In this case, a plurality of through-holes are formed in each of the thin metal plates by performing etching or the like on each of the thin metal plates. Next, the plurality of thin metal plates are laminated to form the plurality of through-holes in the probe supporting plate (Patent Document 1: WO 99/04274 International Patent Publication).

However, recently, since the diameter of a wafer becomes larger and also the demand for a test for inspecting the entire wafer at one time, a so-called full wafer test, is increasing, a diameter of a probe supporting plate also becomes larger. In this situation, if the probe supporting plate is configured by laminating a plurality of thin metal plates as in a conventional art, the mass of the entire probe supporting plate is increased due to the high specific gravity of the thin metal plates. Accordingly, it becomes difficult to handle the probe supporting plate.

The present invention is proposed considering the aforementioned state of art. According to the invention it may be obtained to efficiently form a plurality of through-holes in a probe supporting plate while reducing the mass of the probe supporting plate.

SUMMARY OF THE INVENTION

According to an aspect of the present invention, there is provided a contact structure for inspection of electrical characteristics of an object to be inspected, the contact structure for inspection includes: a plurality of probes which contact the object to be inspected at the time of inspection; a probe supporting plate which supports the plurality of probes, wherein the probe supporting plate has a structure in which a plurality of plate members having therein a plurality of through-holes into which the probes are to be inserted are laminated in a thickness direction, and the probe supporting plate has a mass reducing structure which reduces the mass of the probe supporting plate when compared to the mass of a plurality of plate members when all of the plurality of plate members are metal plates.

According to the present invention, since the probe supporting plate has the mass reducing structure, the mass of the probe supporting plate may be reduced when compared to a case where all of the plurality of plate members are metal plates as in a conventional art. In addition, since the probe supporting plate has the structure in which the plurality of plate members are laminated, a plurality of through holes may be formed in the probe supporting plate, for example by forming a plurality of through-holes in each of the plate members and then laminating the plate members. Accordingly, the plurality of through-holes may be efficiently formed in the probe supporting plate.

The plate members may be metal plates, and the mass reducing structure may be a structure in which a hollow portion passing through the probe supporting plate in the thickness direction of the probe supporting plate is formed.

The hollow portion may be formed by connecting holes formed in each of the metal plates in the thickness direction of the probe supporting plate, and diameters of holes of the metal plates that are an uppermost layer and a lowermost layer may be less than each of diameters of holes of the metal plates that are intermediate layers laminated between the uppermost layer and the lowermost layer.

A diameter of a hole of at least one metal plate among the metal plates that are the intermediate layers may be less than a diameter of a hole of each of the other metal plates.

A polished plate having a polished surface may be additionally laminated on the plurality of metal plates, and in the polished plate, other through-holes connected to the through-holes of the metal plates and another hole connected to the holes of the metal plates to form the hollow portion may be formed.

Diameters of the other through-holes of the polished plate may be greater than the diameters of the through-holes of the metal plates.

The polished plate may be an insulating plate. The polished plate may be a metal plate, and an insulating film may be formed on a surface of the metal plate.

Insulating films may be formed on inner surfaces of the through-holes. A through-pipe having insulating characteristics may be formed on inner surfaces of the through-holes. An insulating film may be formed on a surface of a portion of each of the probes inserted into and passing through the through-holes.

The metal plates may be formed of an NiFe alloy or stainless steel. The NiFe ally may be, for example, kovar, 42 alloy, invar, or the like.

The plurality of plate members may include a metal plate and an insulating plate, and the mass reducing structure may be a structure in which a specific gravity of the insulating plate is less than a specific gravity of the metal plate.

The insulating plate may have a coefficient of thermal expansion greater than that of the metal plate, and a cut portion passing through the insulating plate in a thickness direction of the insulating plate may be formed in the insulating plate.

The insulating plate may be laminated over and under the metal plate, and diameters of through-holes of the metal plate may be greater than diameters of through-holes of the insulating plate.

A lowermost layer of the plate members may be the insulating member, each of through-holes of the insulating plate of the lowermost layer may be formed by connecting an upper through-hole formed in an upper portion of the insulating plate and a lower through-hole formed in a lower portion of the insulating plate, and diameters of the lower through-holes may be greater than diameters of the upper through-holes.

The metal plate may be formed of an NiFe alloy or stainless steel. The NiFe alloy maybe, for example, kovar, 42 alloy, invar, or the like.

The insulating plate may be formed of a glass epoxy resin.

BRIEF DESCRIPTION OF THE DRAWINGS

The above and other features and advantages of the present invention will become more apparent by describing in detail exemplary embodiments thereof with reference to the attached drawings in which:

FIG. 5 is a view for explaining processes for manufacturing the probe supporting plate, wherein FIG. 5(a) shows a state where through-holes and holes are formed in a metal plate, FIG. 5(b) shows a state where through-holes and holes are formed in an insulating plate, FIG. 5(c) shows a state where a plurality of metal plates and the insulating plate are laminated and bonded, and FIG. 5(d) shows a state where a surface of the insulating plate is polished and insulating films are formed on inner surfaces of the through-holes of the metal plates;

FIG. 13 is a view for explaining processes for manufacturing the probe supporting plate according to another embodiment of the present invention, wherein FIG. 13(a) shows a state where through-holes and guide holes are formed in an insulating plate, FIG. 13(b) shows a state where through-holes and guide holes are formed in a metal plate, FIG. 13(c) shows a state where the insulating plates and the metal plate are laminated and bonded, and FIG. 13(d) shows a state where cut portions are formed in the insulating plates;

DETAILED DESCRIPTION OF THE INVENTION

Figure 1:
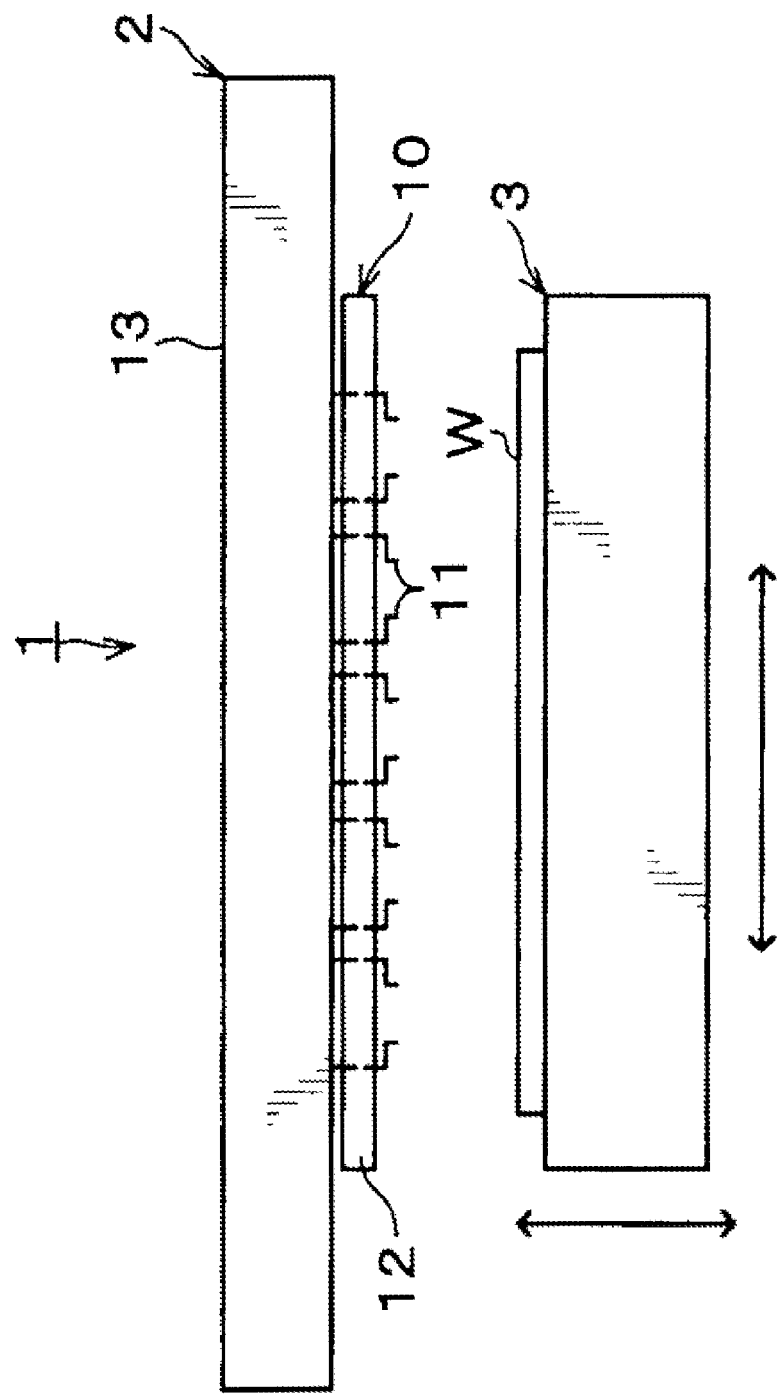
FIG. 1 is a side view schematically showing a configuration of a probe device including a contact structure for inspection according to an embodiment of the present invention.

Herein below, embodiments of the present invention will be explained. FIG. 1 is a side view schematically showing a configuration of a probe device 1 including a contact structure for inspection according to an embodiment of the present invention.

The probe device 1 includes a probe card 2 and a holding stage 3 on which a wafer W is placed as an object to be inspected.

The probe card 2 includes a contact structure for inspection 10 for inspecting electrical characteristics of the wafer W. The contact structure for inspection 10 includes a plurality of probes 11 which contact electrodes of the wafer W at the time of inspection, and a probe supporting plate 12 which supports the plurality of probes 11. The probe supporting plate 12 is formed to face the holding stage 3. Also, the probes 11 supported by the probe supporting plate 12 are formed at positions corresponding to the electrodes of the wafer W.

A circuit board 13 is disposed over a top surface of the probe supporting plate 12. The circuit board 13 may transmit and receive electrical signals to and from the probes 11 through the probe supporting plate 12.

Figure 2:
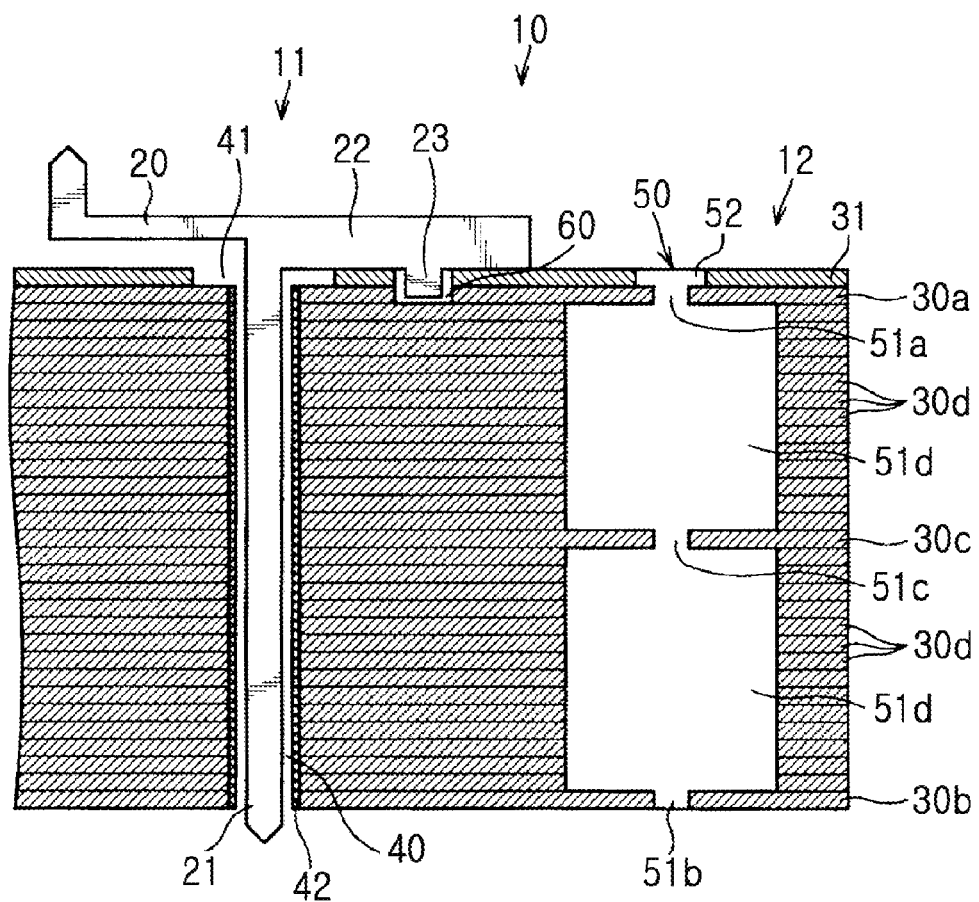
FIG. 2 is a longitudinal-sectional view of the contact structure for inspection.

The probes 11 are formed of a conductive metal material, for example, nickel or the like. As shown in FIG. 2, each of the probes 11 includes a contactor 20 contacting a corresponding electrode of the wafer W and a connection terminal 21 connected to a contact terminal (not shown) of the circuit board 13. The contactor 20 has a so-called cantilever shape. Also, the connection terminal 21 is formed to pass through the probe supporting plate 12 in a thickness direction of the probe supporting plate 12. The contactor 20 and the connection terminal 21 are supported by a supporting portion 22. The supporting portion 22 is attached to a portion connecting the contactor 20 with the connection terminal 21, and extends in a horizontal direction from the connection portion toward a side opposite to the contactor 20. Also, the supporting portion 22 contacts a surface of the probe supporting plate 12. An engaging portion 23 is formed in the supporting portion 22 to protrude toward the probe supporting plate 12. The engaging portion 23 is engaged by the probe supporting plate 12. Due to the supporting portion 22 and the engaging portion 23, the probe 11 is supported by the probe supporting plate 12 at a predetermined height.

Figure 3:
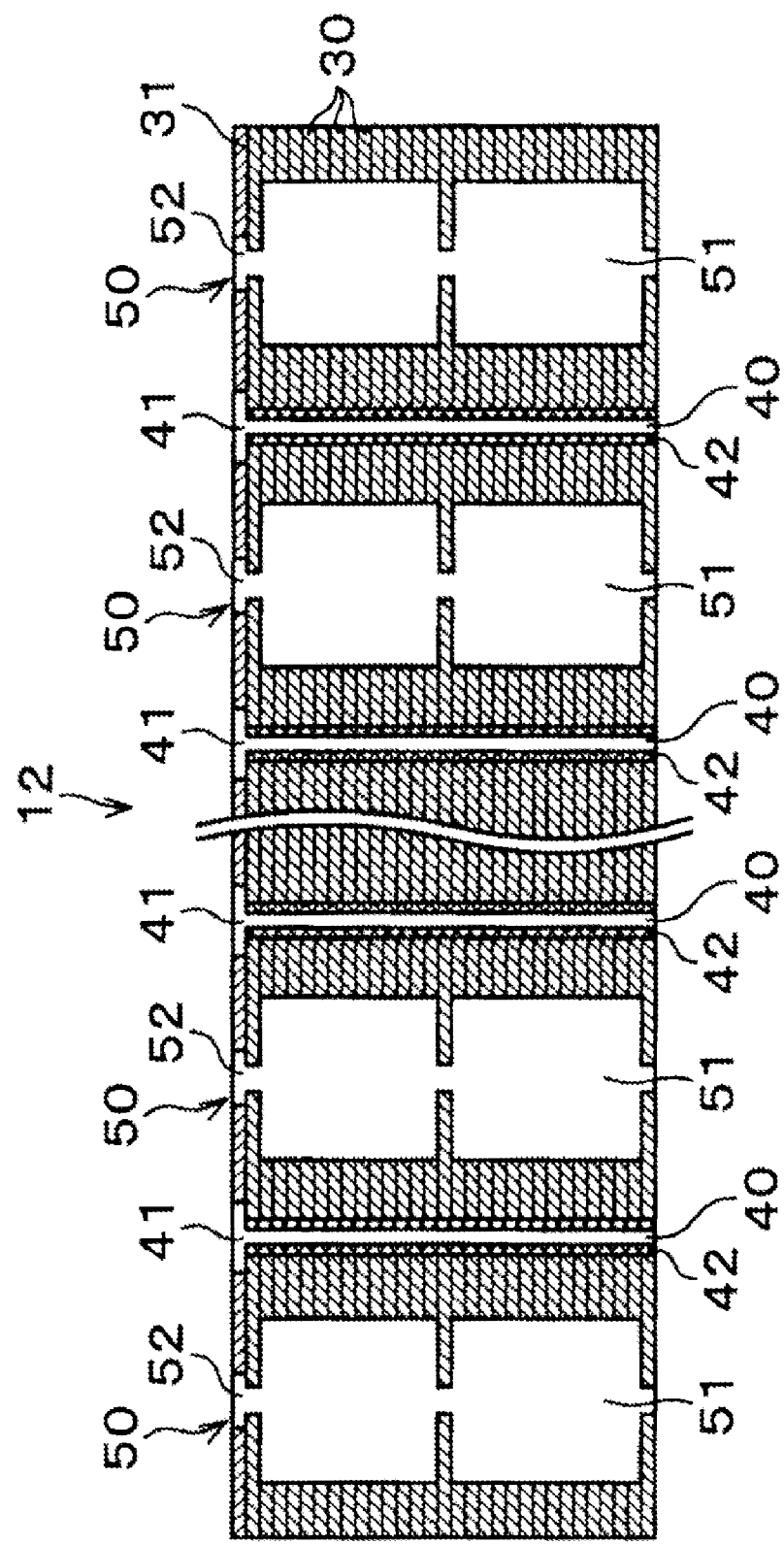
FIG. 3 is a longitudinal-sectional view of a probe supporting plate.
Figure 4:
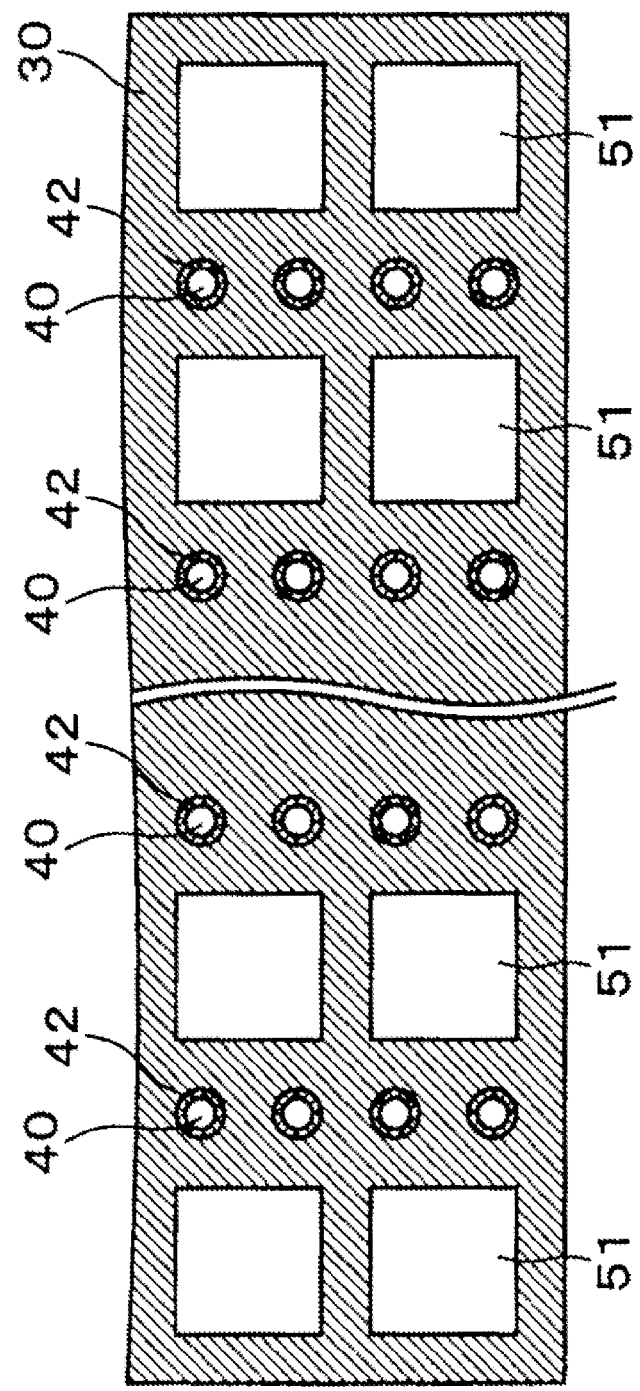
FIG. 4 is a cross-sectional view of the probe supporting plate.

As shown in FIGS. 3 and 4, the probe supporting plate 12 includes, for example, a plurality of quadrangular metal plates 30 as plate members. The plurality of metal plates 30 are laminated and bonded. An insulating plate 31 is additionally laminated and bonded as a polished plate on the plurality of metal plates 30. A surface of the insulating plate 31, that is, a surface contacting the supporting portions 22 of the probes 11 as shown in FIG. 2, is polished. Also, the metal plates 30 and the insulating plate 31 are thin plates each having a thickness of, for example, 0.2 mm. Also, the metal plates 30 are formed of a material having almost the same coefficient of thermal expansion as that of the wafer W and high strength, for example, 42 alloy. The insulating plate 31 is formed of, for example, a glass epoxy resin. Also, the metal plates 30 may be formed of another material, for example, an NiFe alloy such as kovar, invar, or the like, stainless steel, or the like.

Through-holes 40 and other through-holes 41, which the connection terminals 21 of the probes 11 are to be inserted into and to pass through, are respectively formed in each of the metal plates 30 and the insulating plate 31. The through-holes 40 and 41 are connected to each other in the thickness direction of the probe supporting plate 12, and the connected through-holes 40 and 41 pass through the probe supporting plate 12 in the thickness direction of the probe supporting plate 12. Also, the through-holes 41 of the insulating plate 31 have diameters greater than diameters of the through-holes 40 of each of the metal plates 30. The plurality of through-holes 40 and 41 are formed as shown in FIGS. 3 and 4.

Insulating films 42 are formed on inner surfaces of the through-holes 40 as shown in FIG. 2. The insulating films 42 are formed so that inner diameters of the through-holes 40 whereon the insulating films 42 have been formed match with the diameters of the connection terminals 21 of the probes 11. Accordingly, if the probes 11 are inserted into the through-holes 40, the probes 11 may be disposed at predetermined positions. Also, the probes 11 may contact the insulating films 42 but do not directly contact the metal plates 30. Also, the insulating films 42 are formed of a material having insulating characteristics, predetermined strength, adhesion, and chemical resistance, for example, polyimide, fluoride resin, or the like.

The probe supporting plate 12 has a mass reducing structure in which hollow portions 50 passing through the probe supporting plate 12 in the thickness direction of the probe supporting plate 12 are formed. As shown in FIGS. 3 and 4, the hollow portions 50 are formed in the plural at locations other than the locations of the through-holes 40 and 41. Each of the hollow portions 50 is formed by connecting holes 51 formed in each of the metal plates 30 and holes 52, which are other holes formed in the insulating plate 31, in the thickness direction of the probe supporting plate 12. As shown in FIG. 2, a diameter of a hole 51a of a metal plate 30a that is an uppermost layer, a hole 51b of a metal plate 30b that is a lowermost layer, and a hole 51c of a metal plate 30c that is one of intermediate layers laminated between the uppermost layer and the lowermost layer are less than diameters of holes 51d of metal plates 30d that are the others of the intermediate layers, among the plurality of metal plates 30. Also, the holes 52 of the insulating plate 31 have diameters greater than the diameters of the holes 51a of the metal plate 30a that is the uppermost layer.

A hole 60 is formed in the insulating plate 31 and the metal plate 30a that is the uppermost layer. The hole 60 is formed at a position corresponding to the engaging portion 23 of the probe 11. Also, the hole 60 has a diameter slightly greater than the diameter of the engaging portion 23. Then, an adhesive is filled in the hole 60, and the engaging portion 23 is inserted into the hole 60. The engaging portion 23 is fixed to the probe supporting plate 12 in this manner.

As shown in FIG. 1, since the holding stage 3 is configured to freely move horizontally and vertically, the holding stage 3 moves the wafer W placed thereon in a three-dimensional manner. Accordingly the probes 11 of the probe card 2 may contact desired positions on the wafer W.

When electrical characteristics of an electronic circuit of the wafer W are inspected by using the probe device 1 configured as described above, first, the wafer W is placed on the holding stage 3, and then the wafer W is raised toward the probe supporting plate 12 by the holding stage 3. Continuously, the electrodes of the wafer W are respectively brought into contact with the probes 11 corresponding to the electrodes, and thus electrical signals are transmitted and received between the circuit board 13 and the wafer W through the probe supporting plate 12 and the probes 11. Accordingly, the electrical characteristics of the electronic circuit of the wafer W are inspected.

Figure 5:
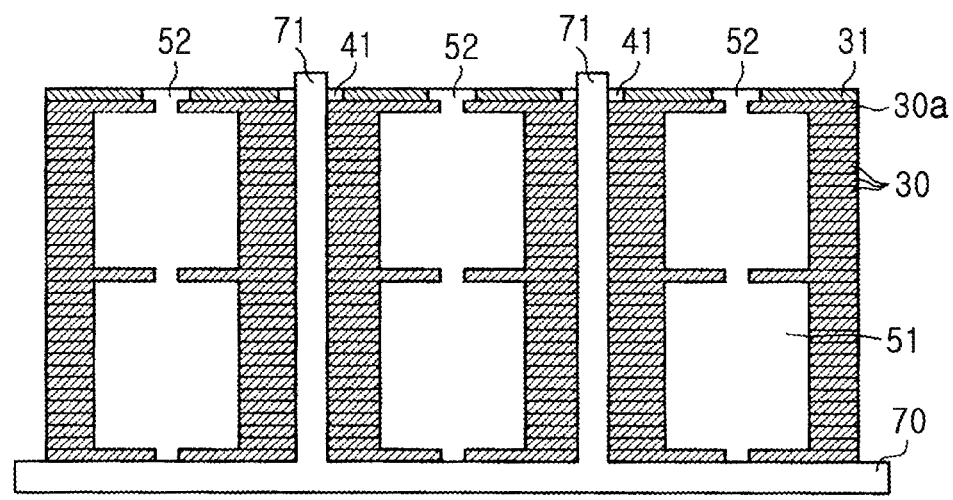
Figure 5:
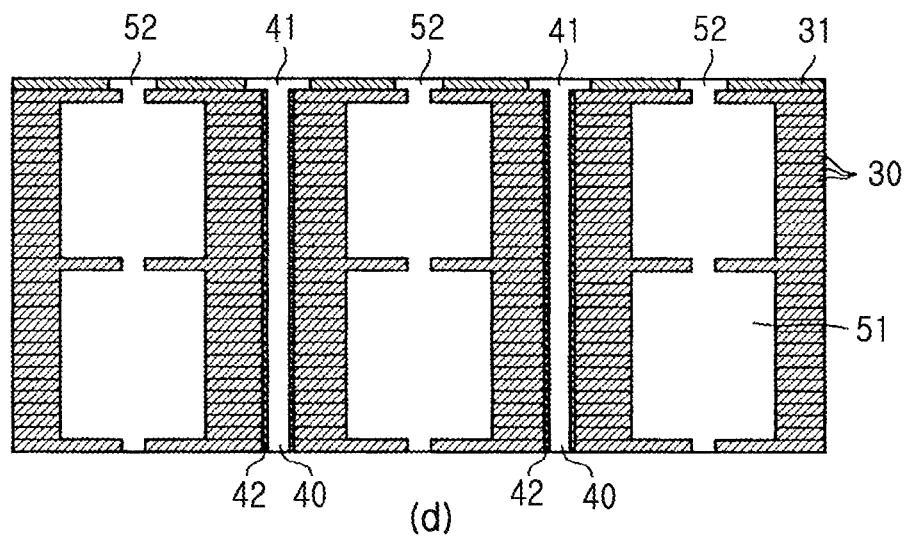

Next, a method for manufacturing the aforesaid probe supporting plate 12 will be explained. FIG. 5 shows each of processes for manufacturing the probe supporting plate 12.

First, for example, photolithography and etching are performed on the plurality of metal plates 30, thereby forming the plurality of through-holes 40 and holes 51 at predetermined positions on each of the metal plates 30, as shown in FIG. 5(a). At this time, the through-holes 40 are formed to have diameters greater than diameters of the connection terminals 21 of the probes 11. Also, as described above, the holes 51a of the metal plate 30a, the holes 51b of the metal plate 30b, and the holes 51c of the metal plate 30c are formed to have diameters less than diameters of the holes 51d of the metal plates 30d. Also, the holes 60 (not shown in FIG. 5(a)) are formed in the metal plate 30a.

Also, as shown in FIG. 5(b), the through-holes 41, the holes 52, and the holes 60 (not shown in FIG. 5(b)) are formed in the insulating plate 31 by, for example, mechanical machining. At this time, as described above, the through-holes 41 are formed to have diameters greater than the diameters of the through-holes 40 of the metal plates 30. Also, the holes 52 are formed to have diameters greater than the diameters of the holes 51a of the metal plate 30a.

Next, as shown in FIG. 5(c), the plurality of metal plates 30 and the insulating plate 31 are laminated by using a guide 70. Guide pins 71 are formed to protrude from the guide 70 at positions corresponding to the plurality of through-holes 40 of the metal plates 30 and the through-holes 41 of the insulating plate 31. The guide pins 71 have diameters matching with the diameters of the through-holes 40. Also, each of the guide pins 71 has a length greater than a total thickness of the plurality of metal plates 30 and the insulating plate 31 which are laminated. Then, the plurality of metal plates 30 are laminated by respectively conforming the through-holes 40 of each of the metal plates 30 to the guide pins 71. Continuously, the insulating plate 31 is laminated on the plurality of metal plates 30 so that the guide pins 71 are inserted into and pass through the through-holes 41 of the insulating plate 31. At this time, the insulating plate 31 and the metal plate 30a that is the uppermost layer are bonded to each other by an adhesive.

Once the plurality of metal plates 30 and the insulating plate 31 are laminated, the guide 70 is removed, and the plurality of metal plates 30 are bonded by diffusion bonding, as shown in FIG. 5(d). In the diffusion bonding, the plurality of metal plates 30 are bonded by pressing and heating the plurality of laminated metal plates 30 in a controlled atmosphere, for example, a vacuum atmosphere, an inert gas atmosphere, or the like.

Once the plurality of metal plates 30 and the insulating plate 31 are bonded, a surface of the insulating plate 31 is polished to be flattened, as shown in FIG. 5(d). Next, the insulating films 42 are respectively formed on inner surfaces of the through-holes 40. The insulating films 42 are formed by adjusting a film thickness of the insulating films 42 so that inner diameters of the through-holes 40 whereon the insulating films 42 have been formed match with the diameters of the connection terminals 21 of the probes 11. Also, the insulating films 42 may be formed, for example, by electrodepositing an insulating material or by depositing an insulating material.

The probe supporting plate 12 is manufactured in this manner.

According to the above embodiment, since the hollow portions 50 are formed at positions other than those of the through-holes 40 and 41 in the probe supporting plate 12, the mass of the probe supporting plate 12 may be reduced due to the hollow portions 50 when compared to a case where only metal plates having only a plurality of through-holes are laminated as in a conventional art. Accordingly, it becomes easy to handle the probe supporting plate 12.

Also, the plurality of through-holes 40 and the holes 51 may be formed in each of the metal plates 30 at one time by performing photolithography and etching on each of the metal plates 30. Accordingly, the plurality of through-holes 40 and 41 and the plurality of hollow portions 50 may be efficiently formed in the probe supporting plate 12.

Also, since the plurality of through-holes 40 of each of the metal plates 30 are formed by performing photolithography and etching on each of the metal plates 30, the fine through-holes 40 may be formed with high precision. Also, since the guide 70 is previously formed and the plurality of metal plates 30 are laminated by conforming the through-holes 40 to the guide pins 71, the plurality of through-holes 40 may be connected to one another with high precision. Also, since the diameters of the through-holes 41 of the insulating plate 31 are greater than the diameters of the through-holes 40 of the metal plates 30, the through-holes 41 are not clogged when the surface of the insulating plate 31 is polished. Since the through-holes 40 and 41 passing through the probe supporting plate 12 in the thickness direction of the probe supporting plate 12 may be appropriately formed in this manner, the plurality of probes 11 may be disposed at predetermined positions of the probe supporting plate 12.

Also, since the insulating films 42 are respectively formed on the through-holes 40 of each of the metal plates 30, the metal plates 30 and the probes 11 are insulated from each other, and thus the metal plates 30 do not affect electrical signals of the probes 11 when electrical characteristics of the wafer W are inspected.

Also, since the inner diameters of the through-holes 40 whereon the insulating films 42 have been formed may match with the diameters of the probes 11, by adjusting the thickness of the insulating films 42 formed on the through-holes 40, the probes 11 may be inserted into appropriate positions of the probe supporting plate 12.

Also, since the hollow portions 50 passing through the probe supporting plate 12 in the thickness direction of the probe supporting plate 12 are formed by connecting the holes 51 of each of the metal plates 30 and the holes 52 of the insulating plate 31, air may flow in the hollow portions 50. Accordingly, even though the air in the hollow portions 50 is thermally expanded at high temperature, for example, when the diffusion bonding is performed on the plurality of metal plates 30 or when electrical characteristics of the wafer W are inspected, the probe supporting plate 12 may be prevented from being thermally expanded, because the air flows out of the hollow portions 50. Also, for example, even when the insides of the hollow portions 50 are cleaned, a cleaning solution flows through the insides of the hollow portions 50, and thus may be prevented from remaining in the insides of the hollow portions 50.

Also, the holes 51a of the metal plate 30a that is the uppermost layer, the holes 51b of the metal plate 30b that is the lowermost layer, and the holes 51c of the metal plate 30c that is one of intermediate layers have diameters less than diameters of the holes 51d of the metal plates 30d that are the others of the intermediate layers. Accordingly, the probe supporting plate 12 may be maintained at high strength, due to the metal plates 30a, 30b, and 30c. Also, the metal plate 30c that is one of the intermediate layers may be formed at an arbitrary position. Also, although the holes 51c are formed in the metal plate 30c that is one of the intermediate layers in the present embodiment, the holes 50c may be formed in a plurality of the metal plates 30c that are intermediate layers.

Also, since the plurality of metal plates 30 are bonded by diffusion bonding, the metal plates 30 may be surface-bonded, and thus bonded surfaces may be maintained at high strength.

Also, the insulating plate 31 is laminated as a polished plate on the plurality of metal plates 30. Accordingly, even though the plurality of metal plates 30 are deformed in a vertical direction due to lamination and diffusion bonding of the plurality of metal plates 30, the surface of the insulating plate 31 may be polished and flattened. Since the surface of the insulating plate 31 has high flatness as described above, the contactors 20 of the probes 11 may be maintained at predetermined heights by brining the supporting portions 22 of the probes 11 into contact with the surface of the insulating plate 31 at predetermined heights. Accordingly, contact between the probes 11 and the electrodes of the wafer W may be stabilized, and thus inspection of electrical characteristics of the wafer W may be appropriately performed.

Also, the metal plates 30 are formed of a material having almost the same coefficient of thermal expansion as that of the wafer W. Accordingly, even though the probe supporting plate 12 or the wafer W is thermally expanded, for example, at the time of inspection, the probes 11 and the electrodes of the wafer W may be appropriately brought into contact with each other.

Also, although the plurality of metal plates 30 are bonded by diffusion bonding in the above embodiment, the plurality of metal plates 30 may be bonded by, for example, spot welding. Also, although the plurality of metal plates 30 and the insulating plate 31 are bonded by inserting the guide pins 71 into the through-holes 40 and 41 of each of the metal plates 30 and the insulating plate 31, the plurality of metal plates 30 and the insulating plate 31 may be bonded by forming separate guide holes in each of the metal plates 30 and the insulating plate 31 and inserting the guide pins 71 into the guide holes.

Figure 6:
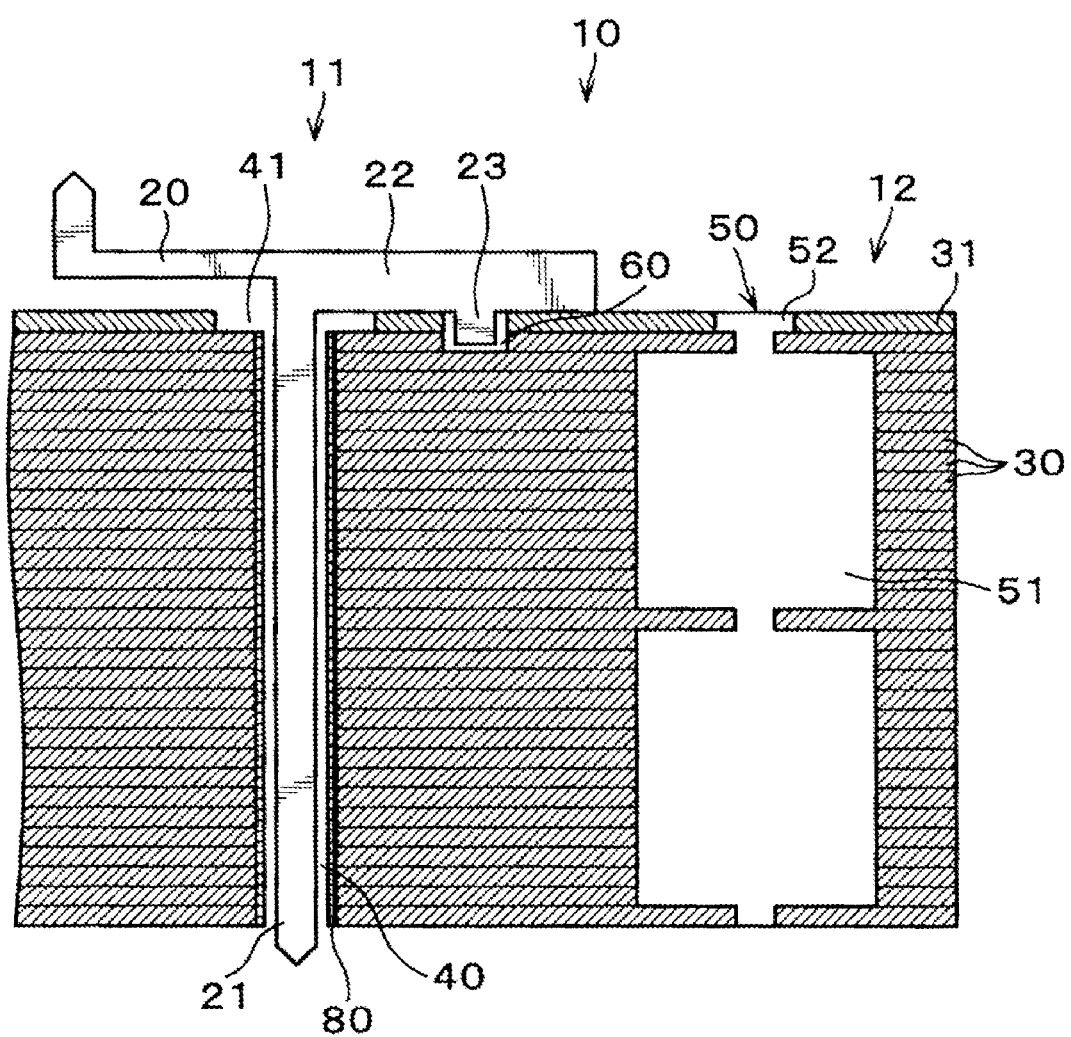
FIG. 6 is a longitudinal-sectional view of a contact structure for inspection according to another embodiment of the present invention.

Although the insulating films 42 are formed on the inner surfaces of the through-holes 40 in the above embodiment, a through-pipe 80 having a property of insulation instead of the insulating films 42 may be formed as shown in FIG. 6. The through-pipe 80 is formed on the inner surfaces of the through-holes 40 like the insulating films 42. An inner diameter of the through-pipe 80 matches with the diameter of the connection terminal 21 of the probe 11, and the connection terminal 21 of the probe 11 may be inserted into and pass through the through-pipe 80. Even in this case, the probe 11 and the metal plates 30 may be insulated from each other. Accordingly, the metal plates 30 do not affect electrical signals of the probe 11 when electrical characteristics of the wafer W are inspected.

Figure 7:
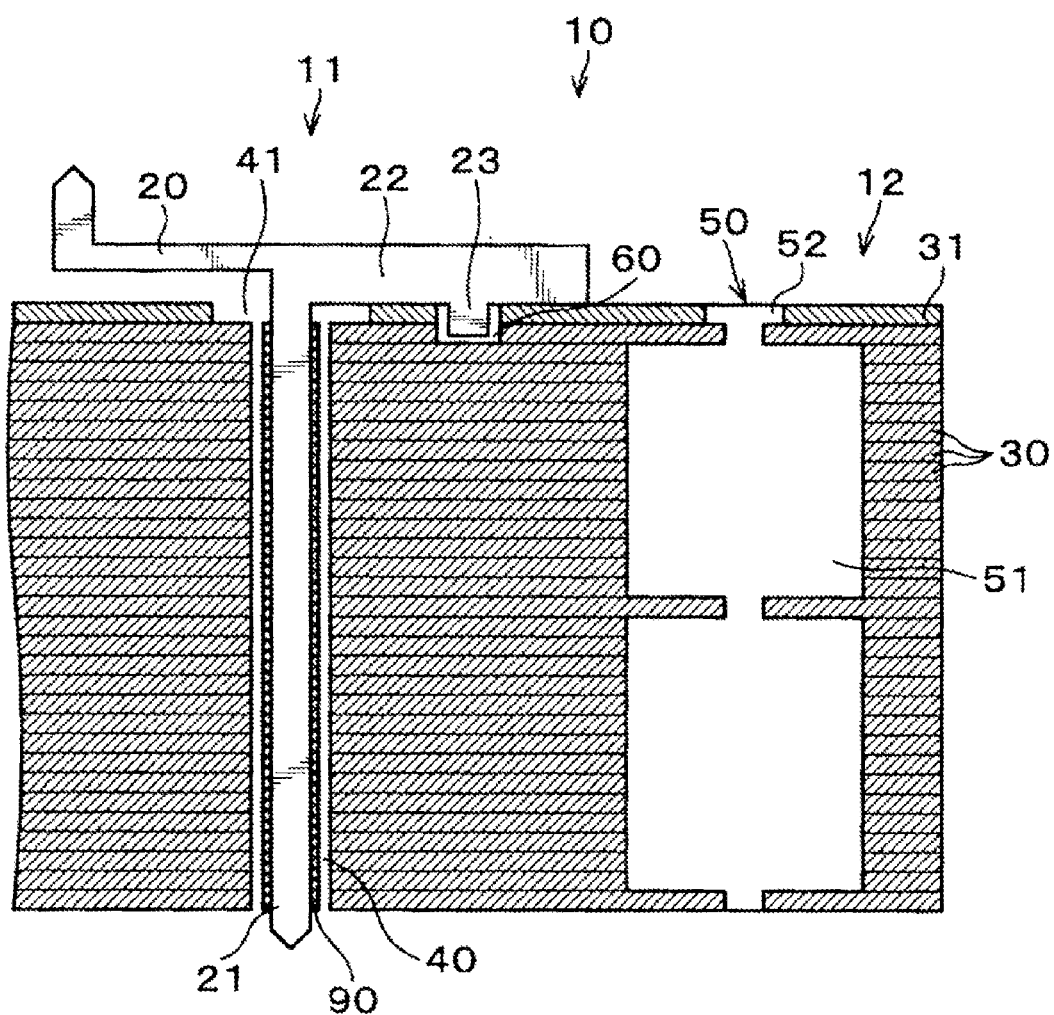
FIG. 7 is a longitudinal-sectional view of a contact structure for inspection according to another embodiment of the present invention.

An insulating film 90 instead of the insulating films 42 may be formed on a surface of the probe 11 as shown in FIG. 7. That is, the insulating film 90 is formed on a surface of the connection terminal 21 of the probe 11 which is inserted into and pass through the through-holes 40. The insulating film 90 may be formed, for example, by electrodepositing an insulating material or by depositing an insulating material. Also, the insulating film 90 may be formed by immersing the probe 11 in an insulating material and removing portions of the insulating material at places other than necessary places. Even in this case, the probe 11 and the metal plates 30 may be insulated from each other.

Also, for example, parts, sensors, or the like, may be mounted in the holes 51d of the metal plates 30d, in the above embodiment. For example, various parts or sensors, such as parts such as modules diagnosing electronic parts mounted on the wafer W as modules, itself, or the like, sensors such as a temperature sensor for detecting the temperature of the probe supporting plate 12, a pressure sensor for detecting a pressure applied to the probe supporting plate 12, or the like, and the like, may be mounted.

Figure 8:
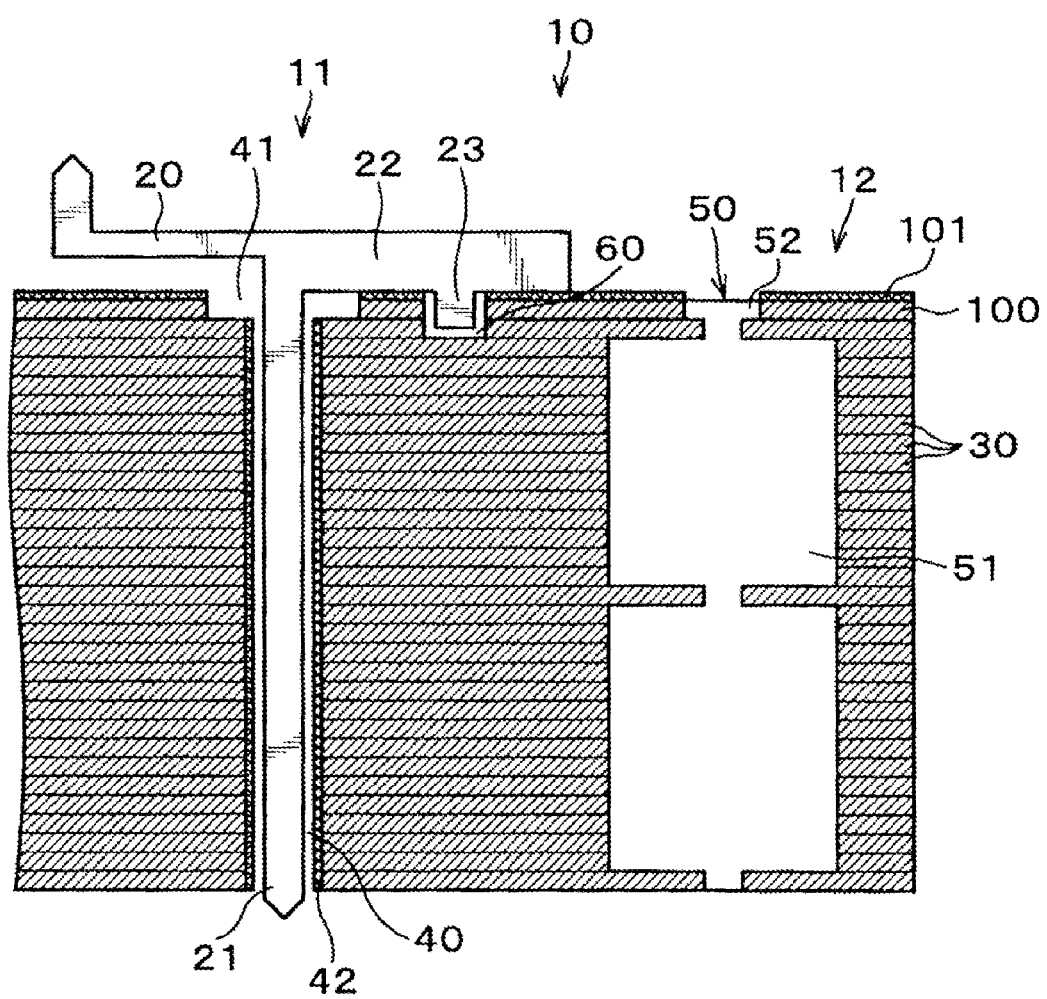
FIG. 8 is a longitudinal-sectional view of a contact structure for inspection according to another embodiment of the present invention.

Although the insulating plate 31 is laminated as a polished plate on the plurality of metal plates 30 in the above embodiments, a metal plate 100 may be used as a polished plate as shown in FIG. 8. The metal plate 100 is formed of the same material as that of the other metal plates 30, for example, 42 alloy. Also, the metal plate 100 has the same structure as the structure of the insulating plate 31, while having a material different from that of the insulating plate 31. That is, the through-hole 41, the hole 52, and the hole 60 are formed in the metal plate 100 like in the insulating plate 31. In this case, after a surface of the metal plate 100 is polished, an insulating film 101 having a predetermined film thickness is formed on the surface of the metal plate 100. The probe 11 and the metal plate 100 are insulated from each other due to the insulating film 101. Also, the insulating film 101 may be formed along with the insulating films 42 on the inner surfaces of the through-holes 40.

Figure 9:
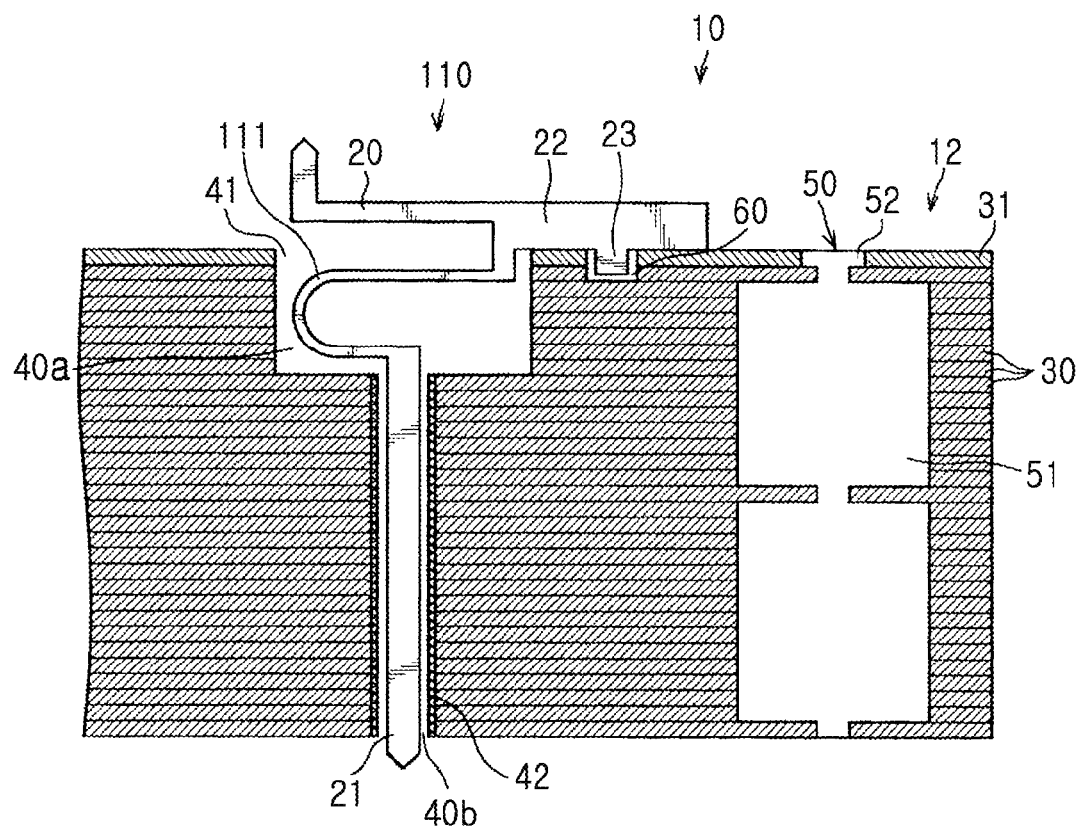
FIG. 9 is a longitudinal-sectional view of a contact structure for inspection according to another embodiment of the present invention.

The probe supporting plate 12 of the above embodiments may be applied to various shapes of probes. For example, as shown in FIG. 9, a probe 110 includes a connecting portion 111 between the contactor 20 and the connection terminal 21 of the probe 11 of the above embodiments. The connecting portion 111 meanders horizontally and is curved at a middle portion that extends vertically, thus the connecting portion 111 has elasticity in the vertical direction. Also, since other configurations of the probe 110 are the same as those of the probe 11 shown in FIG. 2, an explanation thereof will not be given.

In this case, through-holes 40a of metal plates 30 ranging, for example, from a top layer to a seventh layer among the plurality of metal plates 30 of the probe supporting plate 12 are formed to have diameters greater than diameters of through-holes 40b of the other metal plates 30. The diameters of the through-holes 40b are the same as the diameters of the through-holes 40 of the above embodiments. Also, the through-hole 41 of the insulating plate 31 is formed to have the same diameter as the diameter of each of the through-holes 40a. Each of the diameters of the through-holes 40a and 41 is greater than horizontal width of the connecting portion 111 of the probe 11. Then, the connecting portion 111 is disposed in the through-holes 40a and 41.

Also, since predetermined horizontal gaps are formed between the through-holes 40a and 41 and the connecting portion 111, the insulating films 42 do not need to be formed on inner surfaces of the through-holes 40a, and the insulating films 42 may be formed on inner surfaces of the through-holes 40b.

The degree of freedom of the shapes of probes to be inserted into the probe supporting plate 12 may be increased by changing the shapes of the through-holes 40 and 41 formed in the probe supporting plate 12 in this manner.

Next, contact structures for inspection according to other embodiments will be explained.

Figure 10:
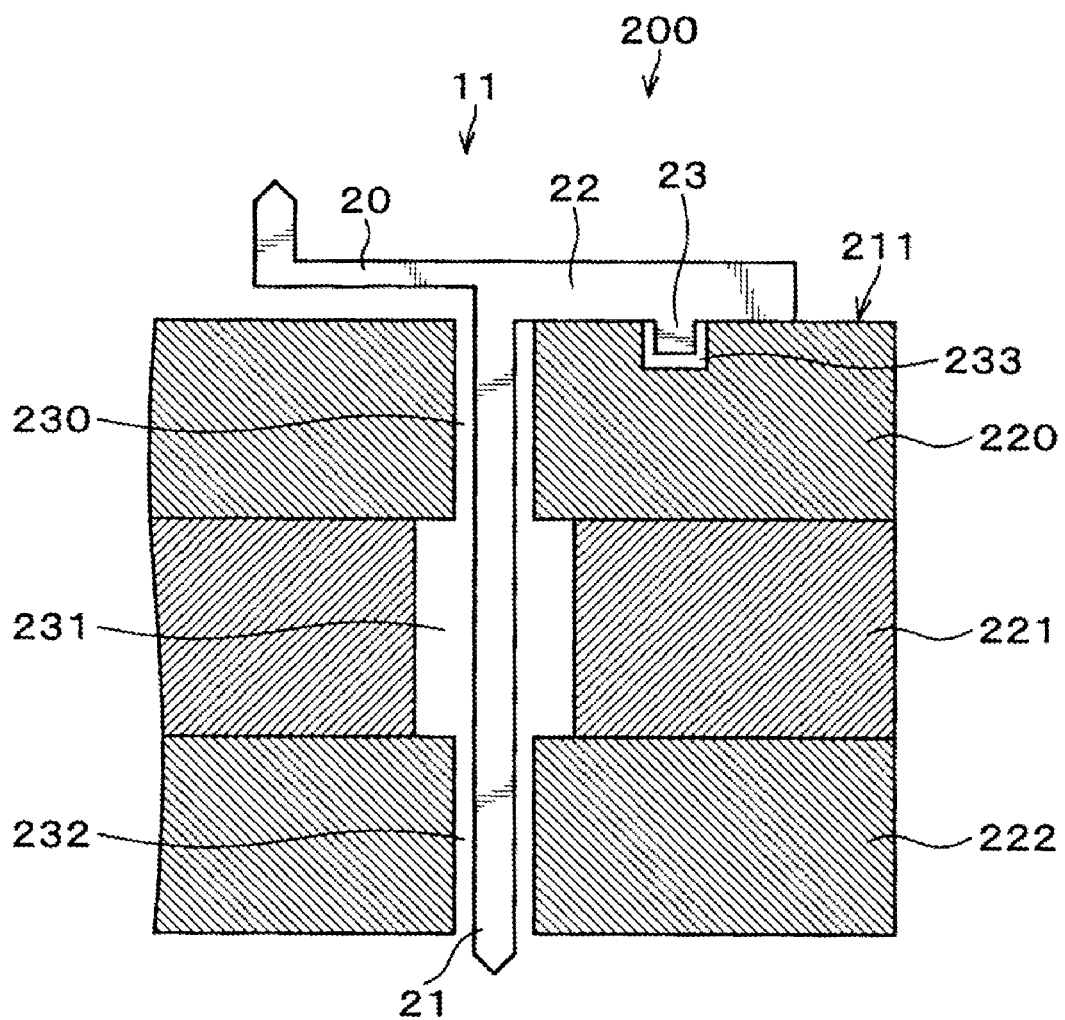
FIG. 10 is a longitudinal-sectional view of a contact structure for inspection according to another embodiment of the present invention.

As shown in FIG. 10, a contact structure for inspection 200 includes the plurality of probes 11, and a probe supporting plate 211 which supports the plurality of probes 11. Also, since the configurations of the probes 11 are the same as those of the probes 11 shown in FIG. 2, an explanation thereof will not be given.

The probe supporting plate 211 has a mass reducing structure of a 3-layer structure where an insulating plate 220, a metal plate 221, and an insulating plate 222, which are, for example, a plurality of plate members, are sequentially laminated and bonded. The insulating plate 220 which is an uppermost layer and the insulating plate 222 which is a lowermost layer are formed of a material having a specific gravity less than that of the metal plate 221, for example, a glass epoxy resin. Each of the insulating plates 220 and 222 has a coefficient of thermal expansion greater than that of the metal plate 221. The metal plate 221 which is an intermediate layer is formed of a material having almost the same coefficient of thermal expansion as that of the wafer W and high strength, for example, 42 alloy. Also, thicknesses of the insulating plates 220 and 222 and the metal plate 221 may be arbitrarily set. Also, the insulating plates 220 and 222 may be formed of other materials, for example, ceramic. Also, the metal plate 221 may also be formed of other materials, for example, an NiFe alloy such as kovar, invar, or the like, stainless steel, silicon, or the like.

Through-holes 230, 231, and 232 which the connection terminals 21 of the probes 11 are to be inserted into and to pass through are respectively formed in the insulating plate 220, the metal plate 221, and the insulating plate 222. The through-holes 230, 231, and 232 are connected in a thickness direction of the probe supporting plate 211, and the connected through-holes 230, 231, and 232 pass through the probe supporting plate 211 in the thickness direction of the probe supporting plate 211. The through-holes 230 and 232 of the insulating plates 220 and 222 have diameters matching with diameters of the connection terminals 21 of the probes 11. Accordingly, the probes 111 may be disposed at predetermined positions of the probe supporting plate 211 due to the through-holes 230 and 232. Also, the through-holes 231 of the metal plate 221 have diameters greater than the diameters of the through-holes 230 and 232 of the insulating plates 220 and 222. Accordingly, the probes 111 may contact the insulating plates 220 and 222, but do not directly contact the metal plate 221. Also, the through-holes 230, 231, and 232 are formed in the plural as shown in FIGS. 11 and 12.

A Hole 233 is formed in the insulating plate 220 that is the uppermost layer as shown in FIG. 10. The hole 233 is formed at a position corresponding to the engaging portion 23 of the probe 11. Also, the hole 233 has a diameter slightly greater than a diameter of the engaging portion 23. Then, an adhesive is filled in the hole 233, and the engaging portion 23 is inserted into the hole 233. The engaging portion 23 is fixed to the probe supporting plate 211 in this manner.

Figure 11:
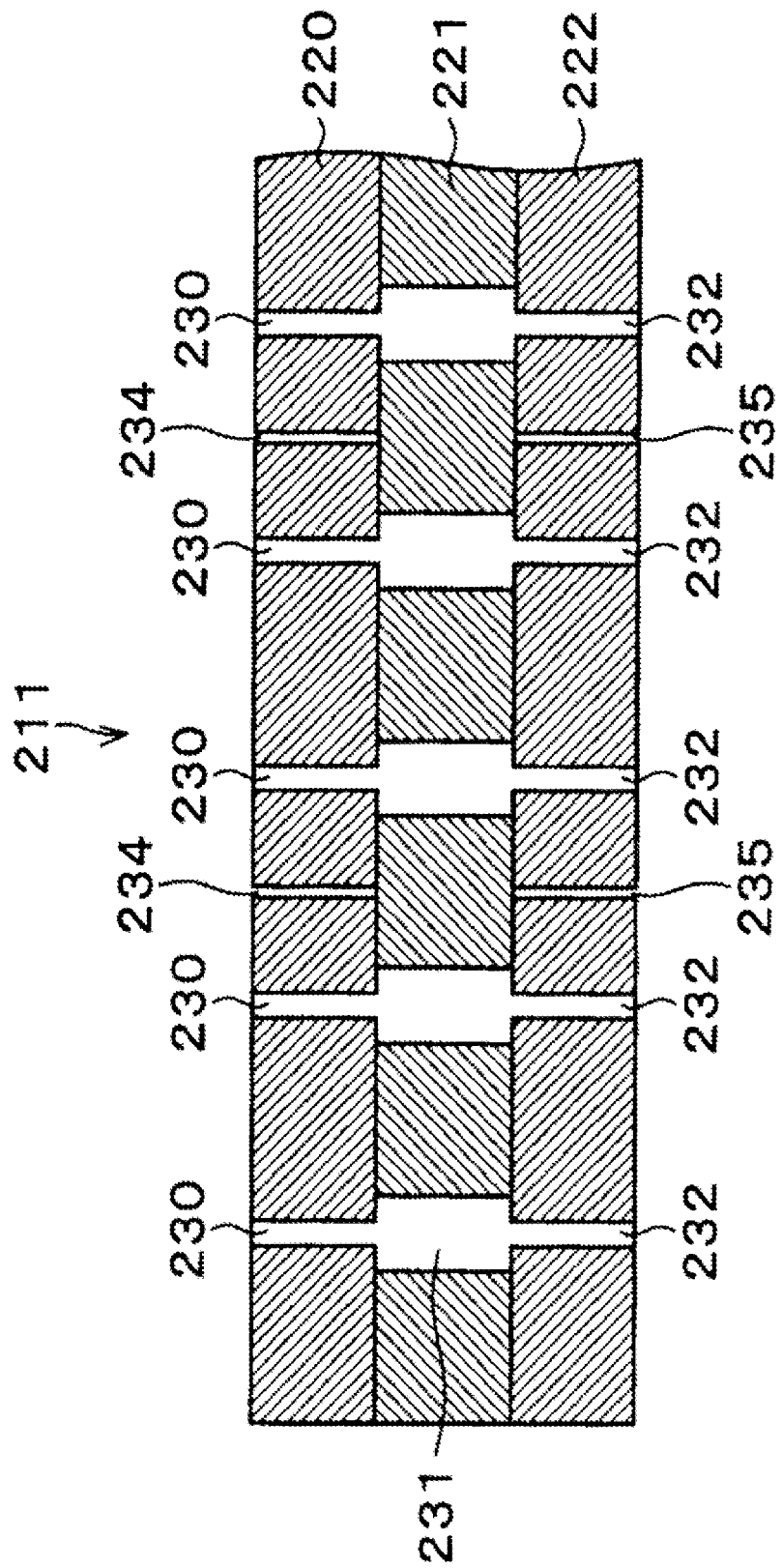
FIG. 11 is a longitudinal-sectional view of a probe supporting plate according to another embodiment of the present invention.
Figure 12:
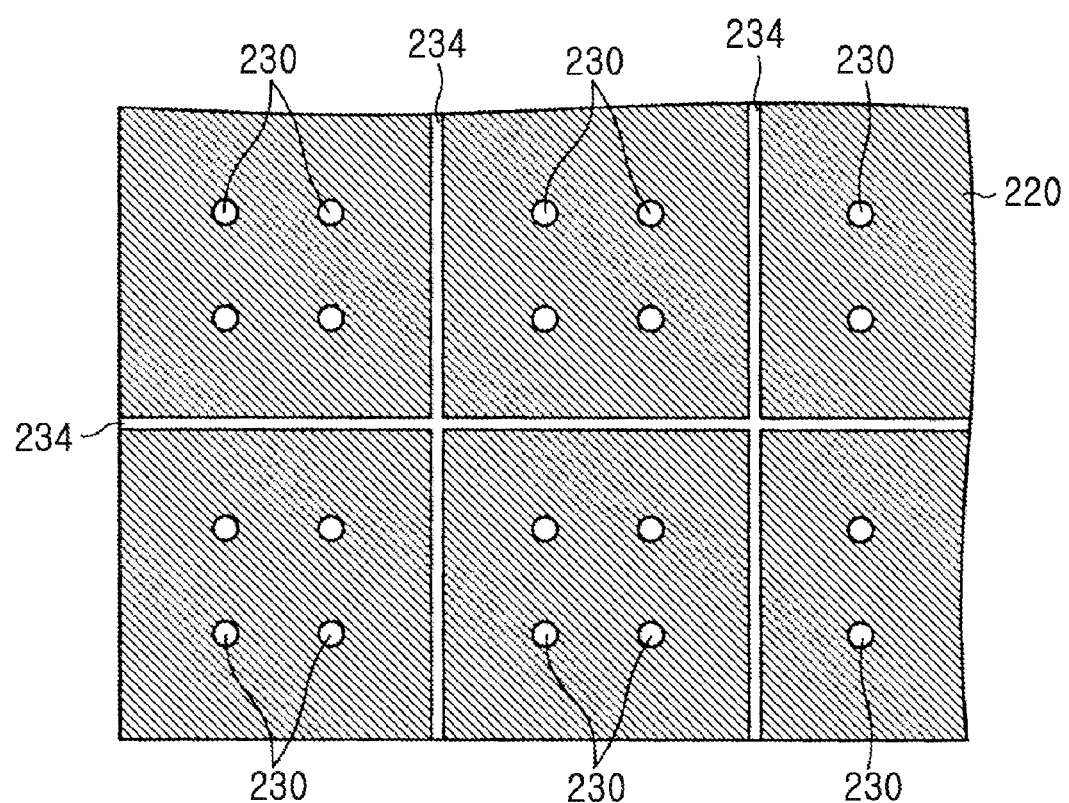
FIG. 12 is a cross-sectional view of the probe supporting plate according to another embodiment of the present invention.

Cut portions 234 are formed in the insulating plate 220 as shown in FIGS. 11 and 12. The cut portions 234 are formed by passing through the insulating plate 220 in a thickness direction of the insulating plate 220, and divide the insulating plate 220 into a plurality of areas. The coefficient of thermal expansion of the insulating plate 220 is greater than that of the metal plate 221 as described above. Therefore, when the probe supporting plate 211 is thermally expanded, for example, at the time of inspection, the insulating plate 220 is expanded greatly compared to the metal plate 221. Accordingly, the insulating plate 220 may be separated from the metal plate 221, or the probe supporting plate 211 may be deformed. In this regard, in the present embodiment, the cut portions 234 are formed in the insulating plate 220. Therefore, the cut portions 234 absorb a difference between thermal expansion of the insulating plate 220 and the metal plate 221, thereby maintaining the shape of the probe supporting plate 211. Also, the cut portions 234 are formed at positions where the through-holes 230 of the insulating plate 220 and the through-holes 231 of the metal plate 221 are not misaligned even when the insulating plate 220 is thermally expanded. That is, the cut portions 234 are formed by dividing the insulating plate 220 so that the probes 11 inserted into the through-holes 230 and 231 and the electrodes of the wafer W are not misaligned.

Also, cut portions 235 are also formed in the insulating plate 222 like in the insulating plate 220. Since shapes or positions of the cut portions 235 are the same as those of the cut portions 234 of the insulating plate 220, an explanation thereof will not be given.

Figure 13:
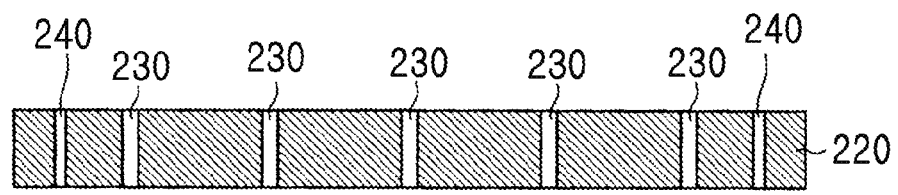
Figure 13:
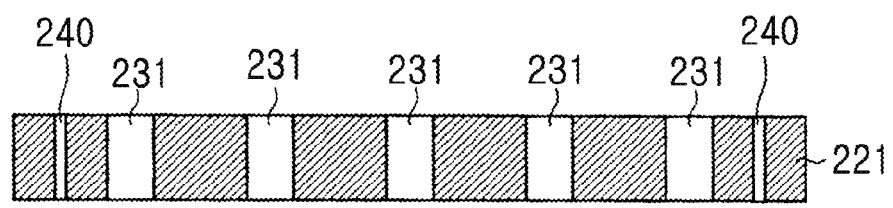
Figure 13:
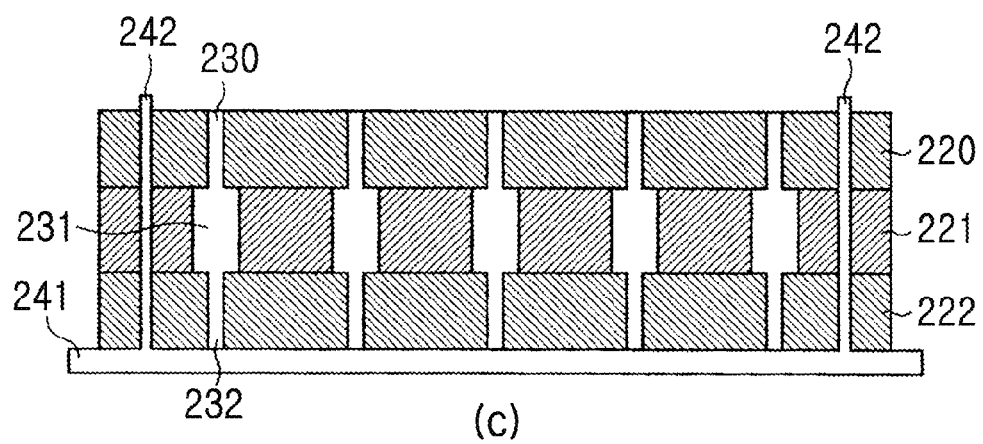
Figure 13:
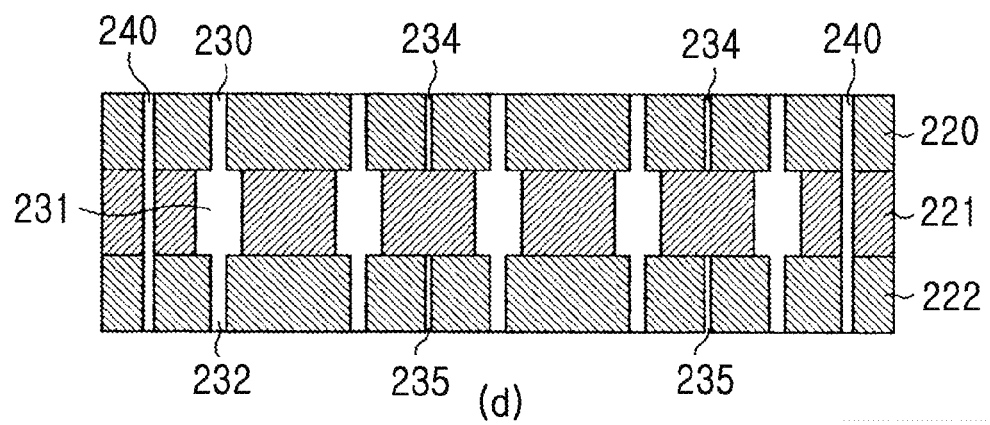

Next, a method for manufacturing the aforesaid probe supporting plate 211 will be explained. FIG. 13 shows each of processes for manufacturing the probe supporting plate 211.

First, as shown in FIG. 13(a), the plurality of through-holes 230 are formed at predetermined positions of the insulating plate 220. Also, guide holes 240 into which guide pins 242, which will be explained later, are to be inserted are formed at predetermined positions of the insulating plate 220. Also, although not shown, the plurality of through-holes 232 and the guide holes 240 are formed at predetermined positions of the insulating plate 222 in the same manner with respect to the insulating plate 222.

Also, as shown in FIG. 13(b), the plurality of through-holes 231 are formed at predetermined positions of the metal plate 221. Also, the guide holes 240 into which the guide pins 242, which will be explained later, are to be inserted are formed at predetermined positions on the metal plate 221.

Next, as shown in FIG. 13(c), the insulating plate 220, the metal plate 221, and the insulating plate 222 are laminated by using a guide 241. The guide pins 242 are formed to protrude from the guide 241 at positions corresponding to the guide holes 240 of the insulating plate 220, the metal plate 221, and the insulating plate 222. The guide pins 242 have diameters matching with diameters of the guide holes 240. Also, the guide pins 242 are formed to have a length greater than a total thickness of the insulating plate 220, the metal plate 221, and the insulating plate 222 which are laminated. Then, the insulating plate 220, the metal plate 221, and the insulating plate 222 are laminated by conforming the guide holes 240 to the guide pins 242. At this time, the insulating plate 220, the metal plate 221, and the insulating plate 222 are each bonded by an adhesive.

Once the insulating plate 220, the metal plate 221, and the insulating plate 222 are laminated, the guide 241 is removed. Continuously, as shown in FIG. 13(d), the cut portions 234 and 235 are respectively formed at predetermined positions of the insulating plates 220 and 222 by using, for example, a dicer.

The probe supporting plate 211 is manufactured in this manner.

In the above embodiments, since the probe supporting plate 211 includes the insulating plates 220 and 222 each having a specific gravity less than that of the metal plate 221, the mass of the probe supporting plate 211 may be reduced due to the insulating plates 220 and 222, when compared to a case where only metal plates having only a plurality of through-holes are laminated as in a conventional art. Accordingly, it becomes easy to handle the probe supporting plate 211.

Also, the through-holes 230 and 232 having fine diameters matching with diameters of the connection terminals 21 of the probes 11 are respectively formed in the insulating plates 220 and 222. That is, the through-holes 230 and 232 requiring high position-precision are formed in the insulating plates 220 and 222 which are easy to process. Meanwhile, the through-holes 231 having diameters greater than the diameters of the through-holes 230 and 232, that is, than the diameters of the connection terminals 21, are formed in the metal plate 221. That is, the through-holes 231 not requiring high position-precision are formed in the metal plate 221 which is relatively difficult to process. Since the insulating plates 220 and 222 and the metal plate 221 are processed in this manner, the predetermined through-holes 230, 231, and 232 may be efficiently formed in the probe supporting plate 211.

Also, since the through-holes 231 of the metal plate 221 have the diameters greater than the diameters of the through-holes 230 and 232 of the insulating plates 220 and 222, the metal plate 221 and the probes 11 are insulated from each other. Accordingly, the metal plate 221 does not affect electrical signals of the probes 11 when electrical characteristics of the wafer are inspected.

Also, the cut portions 234 and 235 are respectively formed in the insulating plates 220 and 222. Therefore, even though the probe supporting plate 211 is thermally expanded, for example, at the time of inspection, the insulating plates 220 and 222 are prevented from being separated from the metal plate 221, and the probe supporting plate 211 is prevented from being deformed. Accordingly, since contact between the probes 11 and the electrodes of the wafer W may be stabilized at the time of inspection, electrical characteristics of the wafer W may be appropriately inspected.

Also, the metal plate 221 is formed of a material having almost the same coefficient of thermal expansion as that of the wafer W. Therefore, even though the probe supporting plate 211 or the wafer W is thermally expanded, for example, at the time of inspection, the probes 11 and the electrodes of the wafer W may be appropriately brought into contact with each other.

Also, the insulating plates 220 and 222 are processed at low costs. Therefore, although the through-holes 230 and 232 requiring high position-precision are formed in the insulating plates 220 and 222, manufacturing costs of the probe supporting plate 211 may be low.

Figure 14:
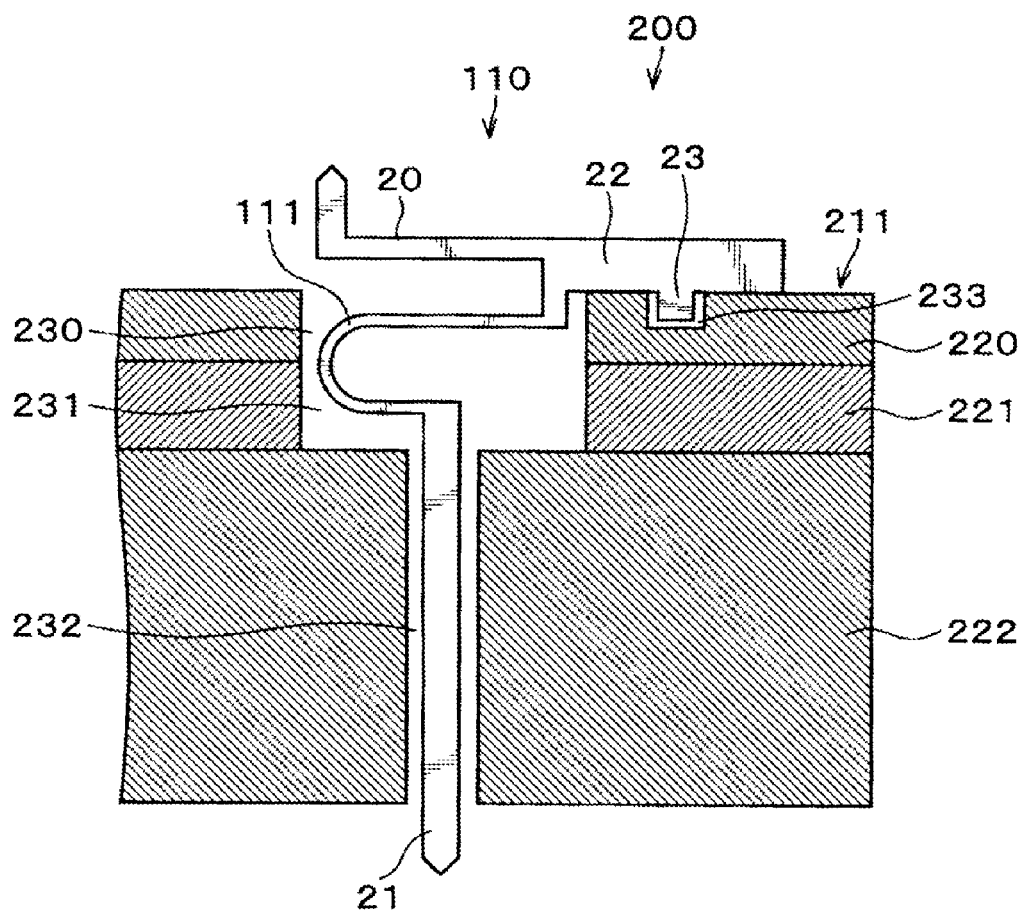
FIG. 14 is a longitudinal-sectional view of a contact structure for inspection according to another embodiment of the present invention.

The probe supporting plate 211 of the above embodiment may be applied to various shapes of probes. For example, the probe supporting plate 211 may support the probe 110 as shown in FIG. 14. Also, since the configurations of the probe 110 are the same as those of the probe 110 shown in FIG. 9, an explanation thereof will not be given.

In this case, the through-hole 230 of the insulating plate 220 and the through-hole 231 of the metal plate 221 are formed to have diameters greater than a diameter of the through-hole 232 of the insulating plate 222. The through-hole 230 and the through-hole 231 have the same diameters.

The diameters of the through-holes 230 and 231 are greater than horizontal widths of the connecting portion 111 of the probe 110. Then, the connecting potion 111 is disposed in the through-holes 230 and 231. Also, the diameter of the through-hole 232 matches with a diameter of the connection terminal 21 of the probe 110.

Also, since predetermined horizontal gap is formed between the connecting portion 111 and the through-holes 230 and 231, the connecting portion 111 and the metal plate 221 do not contact each other, thereby making it unnecessary to form an insulating film on an inner surface of the through-hole 231.

The degree of freedom of the shapes of the probes to be inserted into the probe supporting plate 211 may be increased by changing the shapes of the through-holes 230, 231, and 232 formed in the probe supporting plate 211 in this manner.

Figure 15:
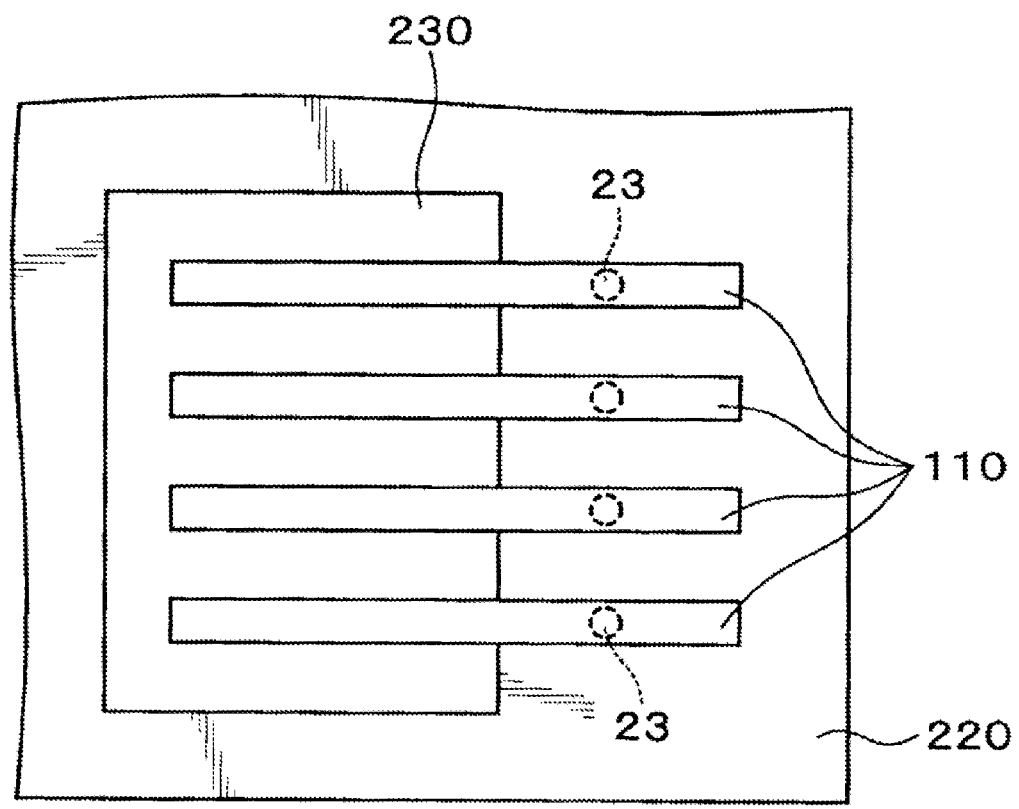
FIG. 15 is a plan view of a contact structure for inspection according to another embodiment of the present invention.

Also, in the above embodiments, a through-hole 230 having a quadrangular shape may be formed as shown in FIG. 15. In this case, the through-hole 231 having a quadrangular shape is formed also in the metal plate 221. Then, the plurality of probes 110 are horizontally disposed in parallel in the through-holes 230 and 231. In this case, since it is possible to make the through-hole 231 large, the metal plate 221 may be more easily processed. Also, as the through-holes 230 and 231 become larger, the mass of the probe supporting plate 211 may be further reduced.

Figure 16:
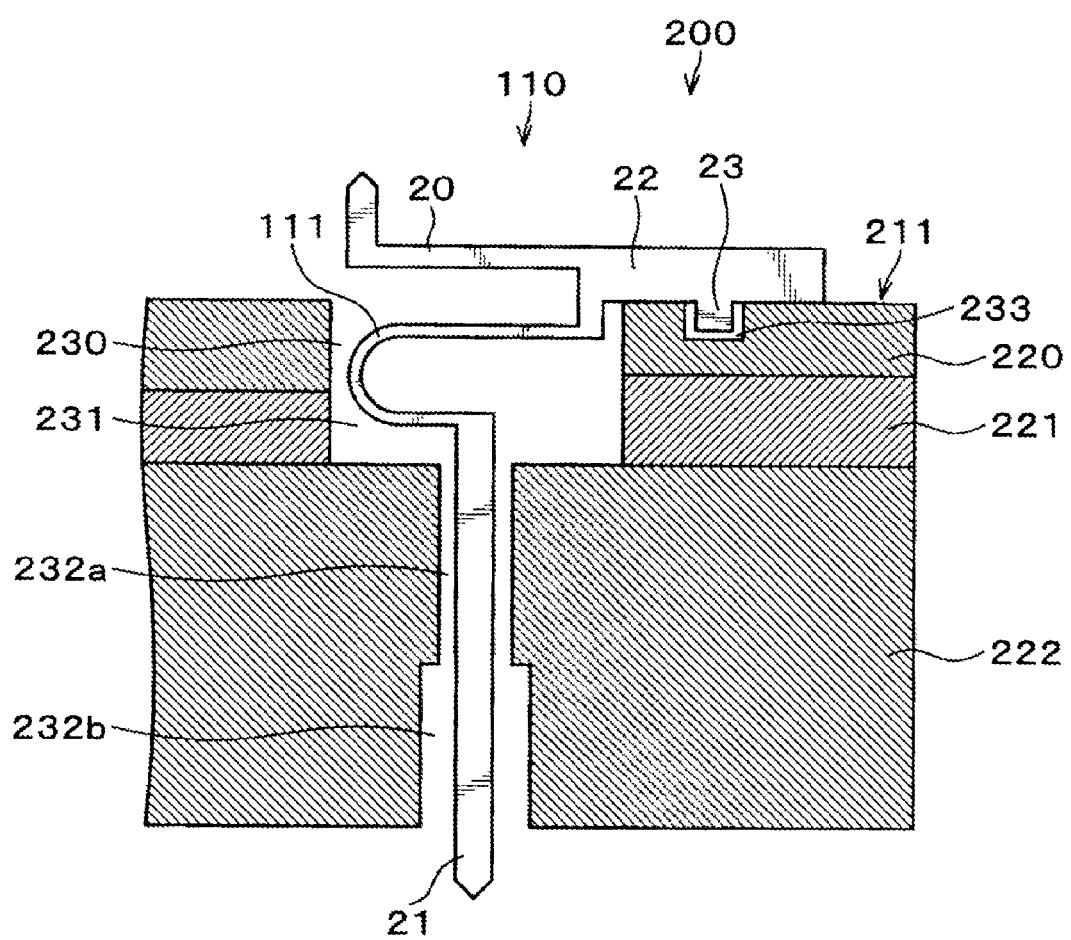
FIG. 16 is a longitudinal-sectional view of a contact structure for inspection according to another embodiment of the present invention.

Also, in the above embodiments, the through-hole 232 of the insulating plate 222 that is the lowermost layer may be formed by connecting an upper through-hole 232a that is formed in an upper portion of the insulating plate 222 to a lower through-hole 232b that is formed in a lower portion of the insulating plate 222 as shown in FIG. 16. In this case, a diameter of the lower through-hole 232b is greater than a diameter of the upper through-hole 232a. Also, the diameter of the upper through-hole 232a matches with the diameter of the connection terminal 21 of the probe 110.

In case that the thickness of the insulating plate 222 is great when the through-hole 232 is formed in the insulating plate 222, the insulating plate 222 may be processed by performing, for example, mechanical machining from both the upper and lower portions of the insulating plate 222. That is, the through-hole 232 is formed by processing the upper through-hole and the lower through-hole in the insulating plate 222. In this case, since it is difficult to form the upper through-hole and the lower through-hole with high position-precision, a step may be formed between the upper through-hole and the lower through-hole. If the connection terminal 21 of the probe 110 is inserted into the through-hole 232 in this state, the connection terminal 21 is blocked by the step between the upper through-hole and the lower through-hole, thereby failing to be inserted and pass. In this regard, in the present embodiment, since the diameter of the lower through-hole 232b is already greater than the diameter of the upper through-hole 232a, the connection terminal 21 may be inserted into the through-hole 232 without being blocked. Accordingly, the connection terminal 21 may be smoothly inserted into and pass through the through-hole 232.

Also, although the probe supporting plate 211 has a 3-layer structure in the above embodiments, the probe supporting plate 211 may have a 2-layer structure or a 4 or more-layer structure. Also, although the metal plate 221 is one plate, the metal plate 221 may be formed by laminating a plurality of thin metal plates. Likewise, each of the insulating plates 220 and 222 may be formed by laminating a plurality of thin insulating plates. Also, a hollow portion other than the through-holes 230, 231, and 232 may be formed in the probe supporting plate 211. Also, the hollow portion may be formed in the same manner as each of the hollow portions 50 shown in FIG. 2.

The present invention may be used for a contact structure for inspection of electrical characteristics of an object to be inspected, for example, a semiconductor wafer or the like.

According to the present invention, a plurality of through-holes may be efficiently formed in a probe supporting plate, and the mass of the probe supporting plate may be reduced.

While very appropriate embodiments of the present invention has been described with reference to by referring to the attached drawings, the present invention is not limited to the embodiments. It will be clearly understood by those of ordinary skill in the art that various modifications or changes can be made within the spirit and scope of the present invention as defined by the following claims and also belong to the spirit and scope of the present invention.

What is claimed is:

1. A contact structure for inspection of electrical characteristics of an object to be inspected, the contact structure for inspection comprising:
   a plurality of probes which contact the object to be inspected at the time of inspection;
   a probe supporting plate which supports the plurality of probes,
   wherein the probe supporting plate has a structure in which a plurality of plate members having therein a plurality of through-holes into which the probes are to be inserted are laminated in a thickness direction, and
   the probe supporting plate has a mass reducing structure which reduces the mass of the probe supporting plate when compared to the mass of a plurality of plate members when all of the plurality of plate members are metal plates.

2. The contact structure for inspection of claim 1, wherein the plate members are metal plates, and
   the mass reducing structure is a structure in which a hollow portion passing through the probe supporting plate in the thickness direction of the probe supporting plate is formed.

3. The contact structure for inspection of claim 2, wherein the hollow portion is formed by connecting holes formed in each of the metal plates in the thickness direction of the probe supporting plate, and
   diameters of holes of the metal plates that are an uppermost layer and a lowermost layer are less than each of diameters of holes of the metal plates that are intermediate layers laminated between the uppermost layer and the lowermost layer.

4. The contact structure for inspection of claim 3, wherein a diameter of a hole of at least one metal plate among the metal plates that are the intermediate layers is less than a diameter of a hole of each of the other metal plates.

5. The contact structure for inspection of claim 2, wherein a polished plate having a polished surface is additionally laminated on the plurality of metal plates, and
   in the polished plate, other through-holes connected to the through-holes of the metal plates and another hole connected to the holes of the metal plates to form the hollow portion are formed.

6. The contact structure for inspection of claim 5, wherein diameters of the other through-holes of the polished plate are greater than the diameters of the through-holes of the metal plates.

7. The contact structure for inspection of claim 5, wherein the polished plate is an insulating plate.

8. The contact structure for inspection of claim 5, wherein the polished plate is a metal plate, and an insulating film is formed on a surface of the metal plate.

9. The contact structure for inspection of claim 2, wherein insulating films are formed on inner surfaces of the through-holes.

10. The contact structure for inspection of claim 2, wherein a through-pipe having insulating characteristics is formed on inner surfaces of the through-holes.

11. The contact structure for inspection of claim 2, wherein a insulating film is formed on a surface of a portion of each of the probes inserted into and passing through the through-holes.

12. The contact structure for inspection of claim 2, wherein the metal plates are formed of an NiFe alloy or stainless steel.

13. The contact structure for inspection of claim 1, wherein the plurality of plate members comprise a metal plate and an insulating plate, and the mass reducing structure is a structure in which a specific gravity of the insulating plate is less than a specific gravity of the metal plate.

14. The contact structure for inspection of claim 13, wherein the insulating plate has a coefficient of thermal expansion greater than that of the metal plate, and a cut portion passing through the insulating plate in a thickness direction of the insulating plate is formed in the insulating plate.

15. The contact structure for inspection of claim 13, wherein the insulating plate is laminated over and under the metal plate, and diameters of through-holes of the metal plate are greater than diameters of through-holes of the insulating plate.

16. The contact structure for inspection of claim 13, wherein a lowermost layer of the plate members is the insulating plate, each of through-holes of the insulating plate of the lowermost layer is formed by connecting an upper through-hole formed in an upper portion of the insulating plate and a lower through-hole formed in a lower portion of the insulating plate, and diameters of the lower through-holes are greater than diameters of the upper through-holes.

17. The contact structure for inspection of claim 13, wherein the metal plate is formed of an NiFe alloy or stainless steel.

18. The contact structure for inspection of claim 13, wherein the insulating plate is formed of a glass epoxy resin.

* * * * *